United States Patent [19]

McShane et al.

[11] Patent Number: 5,012,386
[45] Date of Patent: Apr. 30, 1991

[54] HIGH PERFORMANCE OVERMOLDED ELECTRONIC PACKAGE

[75] Inventors: Michael B. McShane; Paul Lin, both of Austin, Tex.

[73] Assignee: Motorola, Inc., Schaumburg, Ill.

[21] Appl. No.: 428,089

[22] Filed: Oct. 27, 1989

[51] Int. Cl.⁵ .............................................. H05K 7/20
[52] U.S. Cl. .................................... 361/386; 165/185; 357/81; 361/401; 361/406
[58] Field of Search .................. 361/382, 3, 386, 387, 361/388, 401, 414, 406, 421; 174/52, 4, 16, 3; 357/74, 81; 165/80, 3, 185

[56] References Cited

U.S. PATENT DOCUMENTS

| | | | |
|---|---|---|---|
| 4,628,148 | 12/1986 | Endon | 361/410 |
| 4,630,172 | 12/1986 | Stenerson | 361/414 |
| 4,654,694 | 3/1987 | Val | 357/74 |
| 4,677,526 | 6/1987 | Muehling | 361/421 |
| 4,860,165 | 8/1989 | Cassinelli | 361/388 |
| 4,931,908 | 6/1990 | Boucard | 361/414 |
| 4,939,570 | 7/1990 | Bickford | 357/74 |

Primary Examiner—Gerald P. Tolin
Attorney, Agent, or Firm—John A. Fisher

[57] ABSTRACT

A package for containing high performance electronic components, such as high speed integrated circuits (ICs). The package bears a substrate of multiple layers having a cavity therein. Leads may be placed within holes in the substrate and soldered or otherwise electrically connected to conductive patterns or layers in the substrate. A thermally conductive insert is attached to one side of the substate. The insert has a pedestal which protrudes through the cavity in the substrate. An electronic component, such as an IC may then be mounted on the pedestal and electrically connected to a conductive metal pattern on one of the layers of the substrate. This assembly may then be coated with a dielectric material to form the package body, leaving the distal ends of the leads and the back side of the insert exposed. Since the IC chip or other component is directly mounted on the insert, waste heat generated by the chip may be directly channeled outside the package through the insert which effectively forms one wall of the package. The exposed leads may be formed into the desired configuration, including shapes suitable for surface mount technology. The use of a multiple layer substate permits the inclusion of ground and power planes for high performance circuits, such as emitter coupled logic (ECL) gate arrays, within the package itself.

24 Claims, 2 Drawing Sheets

HIGH PERFORMANCE OVERMOLDED ELECTRONIC PACKAGE

FIELD OF THE INVENTION

The invention relates to electronic devices, and, in one aspect, more particularly relates to packages and containers for electronic devices such as integrated circuits, for example.

BACKGROUND OF THE INVENTION

In the art of fabricating integrated circuits (ICs), it is well known that continuing goals are to make the circuits smaller, more dense and have faster operating speeds. The high speed capabilities of the most advanced emitter coupled logic (ECL) gate array products require multiple ground and power planes for their proper functioning. Typically, these multiple ground and power planes are provided by means of a substrate, such as a printed circuit board (PCB) having multiple layers of electrically conductive and dielectric materials, where the conductive layers provide the ground and power planes.

It is also well known that an increasingly important consideration in the production and use of ICs is the package in which the IC resides. The module or casing in which the IC is packaged is an important factor in the ultimate cost, performance and lifetime of the IC. For example, as ICs become more dense, dissipation of the thermal energy generated by them in an efficient manner becomes increasingly important in permitting their useful life to be as long as possible. Another consideration as the circuits become denser is that the number of leads to the package and connections from the leads to the integrated circuit pads increases; thus increasing the complexity of construction and adding to the cost of the end product, not just in terms of increased and more expensive materials, but also increased production costs. These considerations are aggravated with the requirements of high speed circuits, as noted above.

Another factor affecting the design of IC packages is the advent of surface mount technology, whereby space is conserved on the PCBs by mounting the packages directly on the conductive patterns of the circuit board, rather than by extending the leads through holes in the board. One conflict in using surface mount technology is that high performance, multi-layer PCBs generally require through-hole mounting of devices, whereas surface mount devices tolerate only fewer layers. Further, while circuit board space is conserved with surface mount packages, another concern is that the leads of the IC package must be formed much more carefully with particular attention to the coplanarity of the leads that are to be affixed to the conductive pattern. Lack of lead coplanarity will result in the absence of a connection at the lead that is out of the plane of the majority of the leads.

Thus, a continuing goal in the art of providing packages for electronic components such as integrated circuits is a package design that will address these multiple goals satisfactorily in an arrangement that can be reliably manufactured at the lowest cost.

SUMMARY OF THE INVENTION

Accordingly, it is an object of the present invention to provide a high performance package design that will incorporate the multiple ground and power planes needed for high speed circuits.

It is another object of the present invention to provide a high performance package that can be readily and reliably manufactured.

It is yet another object of the invention to provide a high performance integrated circuit package that may have consistently coplanar leads for uniform and defect-free surface mounting.

Still another object of the present invention is to provide an electronic component package with the above attributes that contains a mechanism for rapidly dissipating the thermal heat generated by the electronic component.

In carrying out these and other objects of the invention, there is provided, in one form, an electronic package having its own substrate with a plurality of planar layers, where at least one layer is a dielectric layer and where at least one layer is an electrically conductive layer. The electrically conductive layer may be a power plane or a signal plane, for example; and other electrically conductive layers may be permitted in the substrate for these purposes. The substrate also has at least one hole through the plurality of layers, where the hole is substantially normal to the layers. There is also a cavity within the layers; in one aspect, the cavity may be central to the layers, but is not required to be. At least one lead having a proximal end and a distal end, is present, where the proximal end pierces the hole through the plurality of layers, where the proximal end is additionally electrically connected to the electrically conductive layer. The package also bears a planar thermally conductive insert adjacent to the dielectric layer, where the insert has a first side and a second side, and where a pedestal is present on the first side which protrudes through the cavity within the layers. In one aspect, the thermally conductive insert is fabricated from copper sheet by stamping or the like. An electronic component, such as an IC, for example, having a front surface and a back surface, is mounted by its back surface on the pedestal of the thermally conductive insert. The front surface of the electronic component is electrically connected to one or more of the electrically conductive layers. The package also has a body of dielectric material, such as a suitable high performance plastic, surrounding the substrate and the electronic component, where the distal end of the lead and at least a portion of the second side of the thermally conductive insert are not surrounded by the body.

It will be appreciated that in some of the Figures that the proportions of the various parts are not to scale. For example, the thickness in both FIGS. 1 and 2 have been exaggerated for clarity.

DETAILED DESCRIPTION OF THE INVENTION

Figure 1:
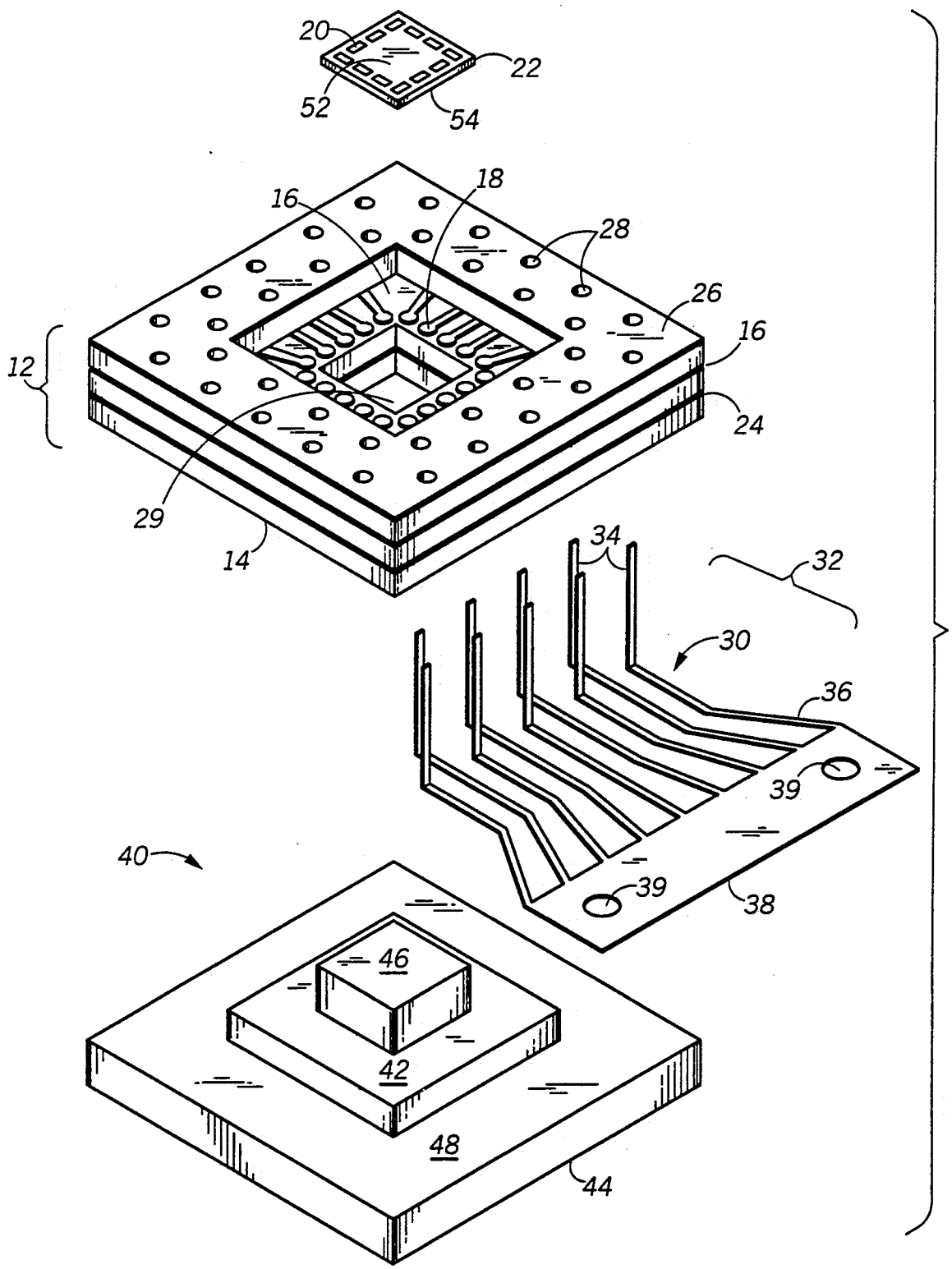
FIG. 1 is an exploded, three-quarters view of some of the components of the high performance electronic package of the present invention.

The invention will now be described in more detail with reference to the various Figures. Shown in FIG. 1 is an exploded view of some of the interior portions of the high performance electronic component package referenced as a whole as 10, seen completed in cross-section in FIG. 2. In the heart of the package 10 is a multilayer substrate 12 having a plurality of planar layers, where at least one of the layers, such as the bottom layer 14 is a dielectric or insulative layer and where at least one of the other layers, such as layer 16, is an electrically conductive layer. This electrically conductive layer 16 may be a patterned layer, such as conventionally found on PCBs and other such substrates, and may have a plurality of terminations or lands 18 for connection to the pads 20 of electronic component 22, which may be an integrated circuit. Electrically conductive pattern 18 may be any commonly used material, such as copper, aluminum, gold, or the like.

It will be appreciated, however, that for the package 10 to have the necessary high performance characteristics for the fastest components, such as ECL ICs, that substrate 12 also will have other conductive layers, such as a ground plane 24 and a power plane 26. Of course, as many other layers as desired may be provided.

Substrate 12 will also be provided with a plurality of through-holes 28 to accommodate the plurality of leads 30 in a pattern corresponding to mate with holes 28. It will be appreciated that the number of actual holes 28 in such a substrate 12 would be much more numerous than as shown in FIG. 1. Only a small number are presented for the sake of clarity. Substrate 12 also bears a cavity 29, which may, in some forms, be central to the substrate 12 but is not required to be. Cavity 29 is present in a lateral position along the plane of substrate 12. The top layers of substrate 12 may also be opened wider to expose the lands 18 of conductive metal pattern 16 for connection to the IC 22, as illustrated in FIG. 1. The use of various layers or "steps" with lands of various distances from the chip for wire bonding chips with large numbers of connections is well known in the art.

In one aspect, the leads 30 may be part of a lead frame quadrant 32. Again, the leads 30 would be considerably more numerous than the number actually shown in FIG. 1. Generally, leads 30 have a proximal end 34 for electrical connection to the appropriate substrate 12 layer and a distal end 36 that is temporarily secured by lead frame bar 38, which is ultimately sheared off to permit the distal ends 36 to form the exterior leads of the package 10. Lead frame bar 38 is provided with holes 39 to assist in alignment during placement and/or molding. It will be understood that if the leads 30 are provided by quadrants 32 that four quadrants 32 around the component 22 will form the entire lead frame. The other three quadrants that would normally be present are not shown in FIG. 1. The lead frame may also be made as one rectilinear component, as is also conventionally done. Quadrants 32 are used because it reduces the cost. If one of the quadrants 32 is damaged in handling or assembly, it is replaced by another quadrant 32, rather than having to replace the entire lead frame. Thus, the manufacturing cost is less when the quadrant design is employed. Note that in the particular configuration of lead frame quadrant 32 of FIG. 1 that the proximal ends 34 of leads 30 are formed to be approximately 90° to the plane of the quadrant 32, including a tolerance, to permit proximal ends 34 to be inserted into through-holes 28. This is the definition of "substantially 90°." Quadrant 32 is parallel to the plane of substrate 12 in this configuration.

Another important part of the high performance electronic package 10 that is seen in FIG. 1 is planar thermally conductive insert 40 which has a first side 42 and a second side 44, where the first side 42 bears an optional pedestal 46. Thermally conductive insert 40 may be made of any of the conventional materials useful in carrying away heat, including, but not limited to, copper, aluminum, and the like. Insert 40 should be designed to meet with the bottom of substrate 12 such that pedestal 46 protrudes through cavity 29 in substrate 12 so that it may bear IC 22. Additionally, if insert 40 is designed with a base 48 wide enough to run under the leads 30, as more clearly shown in FIG. 2, a sufficient gap 50 should be provided so that leads 30 do not touch insert 40, which is normally electrically conductive as well as thermally conductive, to prevent shorting of the leads. Alternatively, base 48 may be made not so wide as to be placed under leads 30 in which event no gap 50 would be required.

In the optional absence of pedestal 46 is simply a flat die area present on first side 42 that is not covered by substrate 12 when in place, but rather is exposed through cavity 29. The flat die area thus accommodates the chip 22 directly. The use of pedestal 46 will depend on a number of factors, including the number of layers in substrate 12.

Planar, thermally conductive insert 46 may be fashioned from any suitable thermally conductive material including, but not limited to, copper, aluminum, iron, alloys thereof, highly conductive ceramics, and the like, and combinations thereof.

Figure 2:
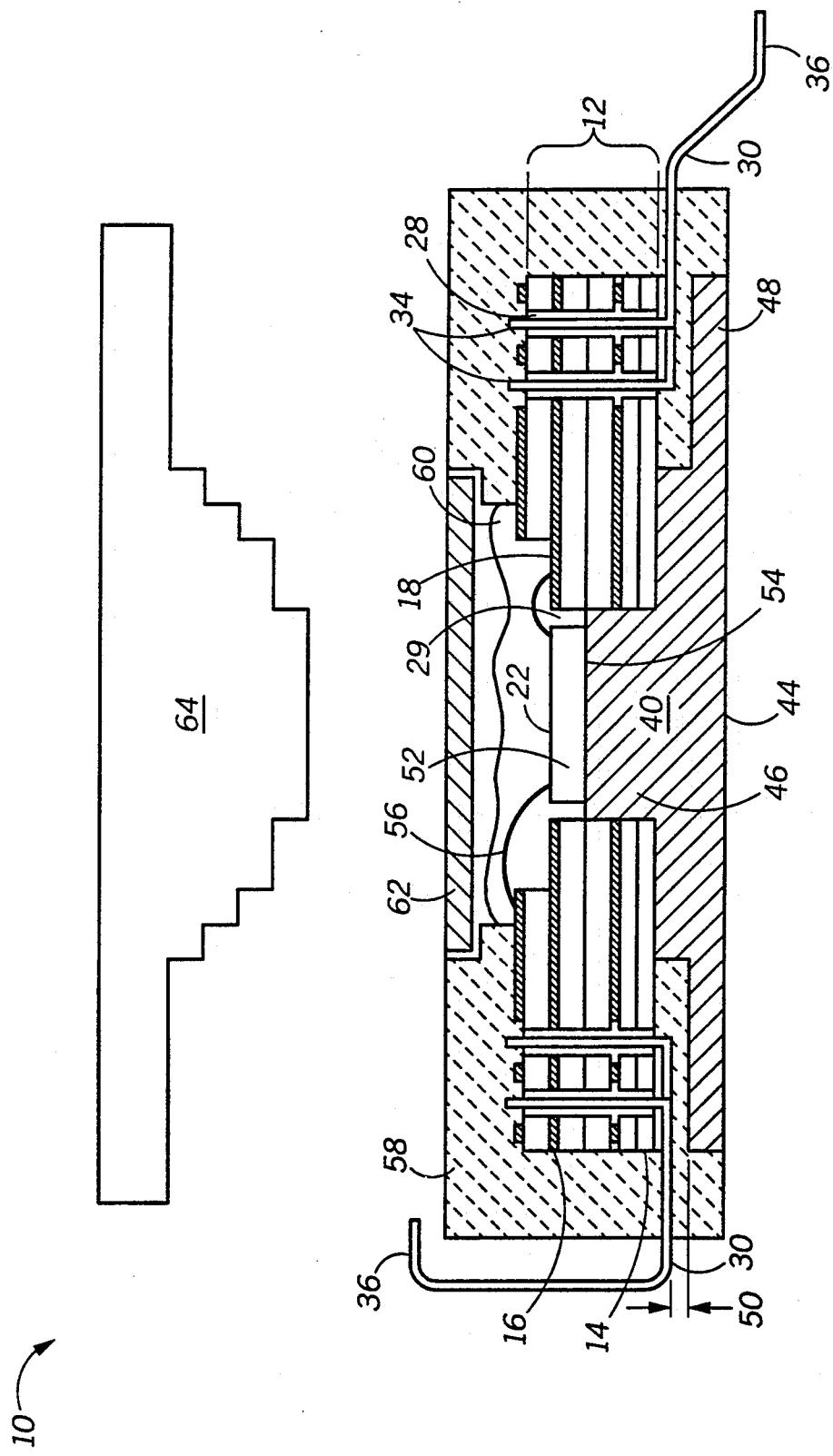
FIG. 2 is a cross-sectional, profile view of an assembled IC package of the present invention.

IC chip 22 has a front surface 52 bearing bonding pads 20 and a back surface 54. Turning to FIG. 2, it will be apparent that the chip 22 is die bonded or otherwise attached to pedestal 46 by its back surface 54 while the bonding pads 20 on the front surface 52 may be bonded to the terminations 18 by wire bonds 56 or other conventional technique. The substrate 12 is covered or encapsulated by a package body 58 of a dielectric material which leaves the distal ends 36 of leads 30 exposed, and the second side 44 of insert 40 open as well. The portion of the substrate 12 bearing the conductive pattern 16 and terminations 18 is also exposed to permit the aforementioned bonding to take place. After bonding, a die coat material 60 may be placed over the chip 22 and bonds 56, a cover 62 is provided and sealed in place over the body 58 so that the chip 22 is completely protected. Die coat materials 60 are well known in the art, and are generally viscous substances that protect the chip 22 and its wire bonds 56. Distal ends 36 of leads 30 are severed from lead frame bar 38 left flat, or formed into a suitable configuration for a surface mount device as shown by the J-lead on the left side of FIG. 2 or a gull wing shape as shown on the right side of FIG. 2. Such surface mount lead shapes additionally include, but are not limited to butt lead shapes.

The high performance package 10 of the present invention will now be described with respect to the procedure by which it may be assembled. Assuming that all of the pertinent components described above are provided, first the proximal ends 34 of leads 30 on quadrant 32 are formed, if necessary, into the proper configuration. In the embodiment shown in FIG. 1, the proximal ends 34 are formed approximately 90° to the plane of quadrant 32. These proximal ends 34 are then inserted into the corresponding holes 28 of substrate 12 and soldered or otherwise attached in place to the appropriate conductive layer of substrate 12. This can be done in a manner similarly to the way that pin grid array (PGA) pins are placed into a PGA substrate, as conventionally done. The insert 40 is then secured in position on the bottom of substrate 12 such that pedestal 46 protrudes through cavity 29 of substrate 12. This step may be accomplished by means of any non-conductive adhesive that is commonly used in the industry. It is not necessary for this adhesive to be thermally conductive, although it may be. This assembly is then encased in the body 58 of dielectric material using conventional transfer molding or overmolding techniques. If the assembly were oriented as shown in FIG. 2, the "top" mold platen would have the profile seen at 64. An advantage to the high performance IC package 10 of this invention is that the insert 40 not only serves as a heat sink or mechanism for channeling heat away from chip 22, but that in the transfer molding process, insert 40 provides a force against the top mold 64. Thus, with the top and bottom forces counterbalanced within the mold, the body 58 can be made with repeatable quality and low mold "flash", or excess plastic in the future work areas. Additionally, the surface of conductive metal pattern 16 to which wire bonds 56 are to be made can be kept clear of mold material. That is, the insert 40 will allow the mold to seal off the die attach and wire bond areas and keep them free from undesirable flash and resin bleed. The mold should also be designed to permit the distal ends 36 of leads 30 to remain exposed and so that the second side 44 of insert 40 remains exposed so that it may channel heat more effectively outside the package, as illustrated in FIG. 2.

The structure and process of this invention also solves the coplanarity problem mentioned earlier. Conventionally, providing surface-mount devices with coplanar leads is a particular problem when lead frame quadrants 32 are used since each quadrant is independent of the others. In other words, the cost savings of using a multiple part lead frame has the disadvantage that with the final product there is more of a problem with coplanarity. As noted, this remains a problem even when one-piece lead frames are used. However, this problem is solved by the present invention because the molding operation should be designed so the distal ends 36 of the leads 30 exit the mold at the parting line, or joint between the two mold halves. Thus, the mold itself would hold the leads 30 at a common plane at the package profile, and any distortion caused by the insertion and soldering or attaching of the internal substrate 12 is cured and made coplanar at the molding operation. It is important that the leads must all be coplanar as the exit from the package body. Coplanarity permits reliable surface mounting of the package on the PCB.

After body 58 is molded, the IC die or chip 22 is attached or "die bonded" via its back surface 54 to pedestal 46. This connection should be made as directly as possible and using an adhesive that does not block thermal transmission, such as the conventional epoxies, solders or the like. The bonding pads 20 on the front surface 52 of chip 22 are then electrically connected to conductive material pattern 16 by wire bonds 56 or other technique, such as tape automated bonding (TAB), or other suitable way. The wire bonds 56 and die 22 are then coated with a protective material in a "die coat" step. The cover 62 is placed in position and sealed using an epoxy material, welding or other suitable technique. The tie bar 38 must be removed for testing the device and subsequent lead formation and attaching the device to the PCB. The leads 30 may then be left flat if the package is to be placed into a chip carrier assembly or formed into a suitable shape for surface mounting, including, but not limited to gull wing, J-lead or butt lead configurations, and the package 10 is ready for mounting on a printed circuit board. It is noted that the package 10 of the present invention could be mounted on a PCB in a variety of positions, depending on how the leads were formed. The package 10 could be mounted where the exposed second side 44 of insert 40 is oriented toward or away from the PCB. In most cases, it is preferred to orient surface 44 away from the PCB to help channel the heat away from the circuits and the PCB.

Many modifications may be made in the structure and process without departing from the scope of the claimed invention. For example, since a multilayer substrate is already employed, the substrate of this invention could be adapted to have two or more levels of patterned traces and thus two or more levels of wire bond shelves. Such technology is already in use for very large die with many bonding pads.

We claim:

1. An electronic package comprising:
   a substrate having:
      a plurality of planar layers, where at least one layer is a dielectric layer and where at least one layer is an electrically conductive layer;
      at least one hole through the plurality of layers; and
      a cavity within the layers;
   a lead having a proximal end and a distal end, where the proximal end pierces the hole through the plurality of layers, where the proximal end is additionally electrically connected to the electrically conductive layer;
   a thermally conductive insert adjacent to the dielectric layer, where the insert has a first side and a second side, where a die area is present on the first side which is exposed through the cavity within the layers;
   an electronic component having a front surface and a back surface, where its back surface is mounted on the die area of the thermally conductive insert and where the front surface is electrically connected to the electrically conductive layer; and
   a body of dielectric material surrounding the substrate and the electronic component, where the distal end of the lead and at least a portion of the second side of the thermally conductive insert are not surrounded by the body.

2. The electronic package of claim 1 where the electronic component is an integrated circuit, and the integrated circuit is completely covered and the cavity is at least partially covered by a die coat material.

3. The electronic package of claim 1 where the body has an opening over the electronic component which is sealed by a cover.

4. The electronic package of claim 1 where the lead has a body that is positioned parallel to the substrate so that the angle between the proximal end and the lead body is substantially 90°.

5. The electronic package of claim 1 where the distal end of the lead has a shape suitable for surface mounting selected from the group consisting of J-lead, gull-wing and butt lead.

6. The electronic package of claim 1 where the substrate additionally comprises ground and power planes.

7. The electronic package of claim 1 where the planar thermally conductive insert is made from a material selected from the group consisting of copper, aluminum, iron, alloys thereof, highly conductive ceramics and combinations thereof.

8. An electronic package comprising:

a substrate having:
  a plurality of planar layers, where at least one layer is a dielectric layer and where at least one layer is an electrically conductive layer;
  at least one hole through the plurality of layers; and
  a cavity within the layers;
a lead having a proximal end and a distal end, where the proximal end pierces the hole through the plurality of layers, where the proximal end is additionally electrically connected to the electrically conductive layer;
a thermally conductive insert adjacent to the dielectric layer, where the insert has a first side and a second side, where a pedestal is present on the first side which protrudes through the cavity within the layers;
an electronic component having a front surface and a back surface, where its back surface is mounted on the pedestal of the thermally conductive insert and where the front surface is electrically connected to the electrically conductive layer; and
a body of dielectric material surrounding the substrate and the electronic component, where the distal end of the lead and at least a portion of the second side of the thermally conductive insert are not surrounded by the body.

9. The electronic package of claim 8 where the electronic component is an integrated circuit, and the integrated circuit is completely covered and the cavity is at least partially covered by a die coat material.

10. The electronic package of claim 8 where the body has an opening over the electronic component which is sealed by a cover.

11. The electronic package of claim 8 where the lead has a body that is positioned parallel to the substrate so that the angle between the proximal end and the lead body is substantially 90°.

12. The electronic package of claim 8 where the distal end of the lead has a shape suitable for surface mounting selected from the group consisting of J-lead, gull-wing and butt lead.

13. The electronic package of claim 8 where the substrate additionally comprises ground and power planes.

14. The electronic package of claim 8 where the planar thermally conductive insert is made from a material selected from the group consisting of copper, aluminum, iron, alloys thereof, highly conductive ceramics and combinations thereof.

15. An electronic package comprising:
a substrate having:
  a plurality of planar layers, where at least one layer is a dielectric layer and where at least one layer is an electrically conductive layer;
  at least one hole through the plurality of layers, substantially normal to the layers; and
  a cavity through the layers;
leads for the holes in the substrate, where each lead has a proximal end, a body portion and a distal end, where the proximal end pierces the hole through the plurality of layers, where the proximal end is additionally electrically connected to the electrically conductive layer and the body portion is parallel to the substrate such that the angle between the proximal end and the lead body is substantially 90°;
a planar thermally conductive insert adjacent to the dielectric layer, where the insert has a first side and a second side, where a pedestal is present on the first side which protrudes through the cavity within the layers;
an electronic component having a front surface and a back surface, where its back surface is mounted on the pedestal of the thermally conductive insert and where the front surface is electrically connected to the electrically conductive layer; and
a body of dielectric material surrounding the substrate and the electronic component, where the distal end of the lead and at least a portion of the second side of the thermally conductive insert are not surrounded by the body.

16. The electronic package of claim 15 where the electronic component is an integrated circuit, and the integrated circuit is completely covered and the cavity is at least partially covered by a die coat material.

17. The electronic package of claim 15 where the body has an opening over the electronic component which is sealed by a cover.

18. The electronic package of claim 15 where the distal end of the lead has a shape suitable for surface mounting selected from the group consisting of J-lead, gull-wing and butt lead.

19. The electronic package of claim 15 where the substrate additionally comprises ground and power planes.

20. The electronic package of claim 15 where the planar thermally conductive insert is made from a material selected from the group consisting of copper, aluminum, iron, alloys thereof, highly conductive ceramics and combinations thereof.

21. A high performance, surface mount electronic package comprising:
a substrate having:
  a plurality of planar layers, where at least one layer is a dielectric layer, where at least one layer is a patterned electrically conductive layer, and at least one ground plane and at least one power plane;
  at least one hole through the plurality of layers, substantially normal to the layers; and
  a cavity through the layers;
leads for the holes in the substrate, where each lead has a proximal end, a body portion and a distal end, where the proximal end pierces the hole through the plurality of layers, where the proximal end is additionally electrically connected to the electrically conductive layer and the body portion is parallel to the substrate such that the angle between the proximal end and the lead body is substantially 90°;
a planar thermally conductive insert adjacent to the dielectric layer, where the insert has a first side and a second side, where a pedestal is present on the first side which protrudes through the cavity within the layers;
an electronic component having a front surface and a back surface, where its back surface is mounted on the pedestal of the thermally conductive insert and where the front surface is electrically connected to the electrically conductive layer;
a body of dielectric material surrounding the substrate and the electronic component, where the distal end of the lead and at least a portion of the second side of the thermally conductive insert are not surrounded by the body; and distal lead ends suitable for surface mounting, where the shape is selected from he group consisting of J-lead, gull-wing and butt lead.

22. The electronic package of claim 21 where the electronic component is an integrated circuit, and the integrated circuit is completely covered and the cavity is at least partially covered by a die coat material.

23. The electronic package of claim 21 where the body has an opening over the electronic component which is sealed by a cover.

24. The electronic package of claim 21 where the planar thermally conductive insert is made from a material selected from the group consisting of copper, aluminum, iron, alloys thereof, highly conductive ceramics and combinations thereof.

* * * * *